US006714239B2

(12) United States Patent
Guidash (10) Patent No.: US 6,714,239 B2
(45) Date of Patent: *Mar. 30, 2004

(54) ACTIVE PIXEL SENSOR WITH PROGRAMMABLE COLOR BALANCE

(75) Inventor: Robert M. Guidash, Rush, NY (US)

(73) Assignee: Eastman Kodak Company, Rochester, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/960,418

(22) Filed: Oct. 29, 1997

(65) Prior Publication Data

US 2002/0180875 A1 Dec. 5, 2002

(51) Int. Cl.[7] .......................... H04N 9/73; H04N 9/083; H04N 3/14
(52) U.S. Cl. ................... 348/223.1; 348/280; 348/297; 348/308
(58) Field of Search ................................ 348/223, 296, 348/297, 304, 308, 280, 281, 282, 96, 223.1

(56) References Cited

U.S. PATENT DOCUMENTS

| 4,500,915 A |   | 2/1985  | Koike et al. ................... 358/44  |
|-------------|---|---------|------------------------------------------|
| 4,504,865 A | * | 3/1985  | Nishizawa et al. .......... 348/281       |
| 4,709,259 A | * | 11/1987 | Suzuki ......................... 348/304  |
| 5,105,264 A | * | 4/1992  | Erhardt ........................ 348/282  |
| 5,541,645 A | * | 7/1996  | Davis ............................ 348/96  |
| 6,051,447 A | * | 4/2000  | Lee et al. ..................... 257/292  |

FOREIGN PATENT DOCUMENTS

| EP | 0 396 093 A2 | 11/1990 | ......... H01L/27/148 |
| EP | 0 693 786 A2 | 1/1996  | ......... H01L/27/146 |
| EP | 0 738 010 A2 | 10/1996 | ......... H01L/27/148 |

OTHER PUBLICATIONS

Abstract of EP 98203495.1.
Patent Abstracts of Japan: Publication No. 62073878, Publication Date: Apr. 4, 1987.
European Communication: European Search Report for E.P. Appln. No. 98203495.1, which corresponds to U.S. Ser. No. 08/960,418, filed Oct. 29, 1997.
R.H. Nixon, S.E. Kemeny, C.O. Staller and E.R. Fossum, "128×128 CMOS Photodiode–type Active Pixel Sensor With On–Chip Timing, Control and Signal Chain Electronics", 1995.
Hon–Sum Wong, "Technology and Device Scaling Considerations for CMOS Imagers", pp. 2131–2142.
Eric R. Fossum, "Active Pixel Sensors: Are CCD's Dinosaurs?".
Masanori, Ogata, Tsutomu Nakamura, Kazuya Matsumoto, Ryo Ohta, and Ryouji Hyuga, "A Small Pixel CMD Image Sensor", 1991, pp. 1005–1010.
Fumihiko Andoh, et al, "A 250,000 Pixel Image Sensor with FET Amplification at Each Pixel for High Speed Television Camerias".
J.E. D. Hurwitz et al, "An 800K–Pixel Colro CMOS Sensor for Consumer Still Cameras".

* cited by examiner

*Primary Examiner*—Aung Moe
*Assistant Examiner*—Luong Nguyen
(74) *Attorney, Agent, or Firm*—Peyton C. Watkins (57) ABSTRACT

A semiconductor based image sensor comprising a plurality of pixels formed upon a major surface of a semiconductor substrate, a majority of the pixels having a photodetector with a plurality of color filters of at least two different colors arranged over a second majority of the pixels a sense node formed within each of the pixels and operatively connected to CMOS control circuitry a plurality of busses arranged such that there is at least one unique bus operatively connected to the pixels for each color and interface means for providing an electrical connection to a timing circuit, the interface means having individual connections to each of the busses and capable of providing the predetermined voltage on the busses at a desired time.

27 Claims, 11 Drawing Sheets

ACTIVE PIXEL SENSOR WITH PROGRAMMABLE COLOR BALANCE

FIELD OF THE INVENTION

This invention relates to the field of solid state photo-sensors and imagers referred to as Active Pixel Sensors, (APS) and more specifically to providing a means to provide programmable color balance for a color image sensor, while maintaining a high signal to noise ratio (SNR).

BACKGROUND OF THE INVENTION

APS devices are solid state imagers wherein each pixel typically contains a photo-sensing means, reset means, a charge transfer means, a charge to voltage conversion means, and all or part of an amplifier. APS devices have been operated in a manner where each line or row within the imager is selected and read out using a row and column select signal, (analogous to a word and bit line in memory devices respectively).

Figure 1A:
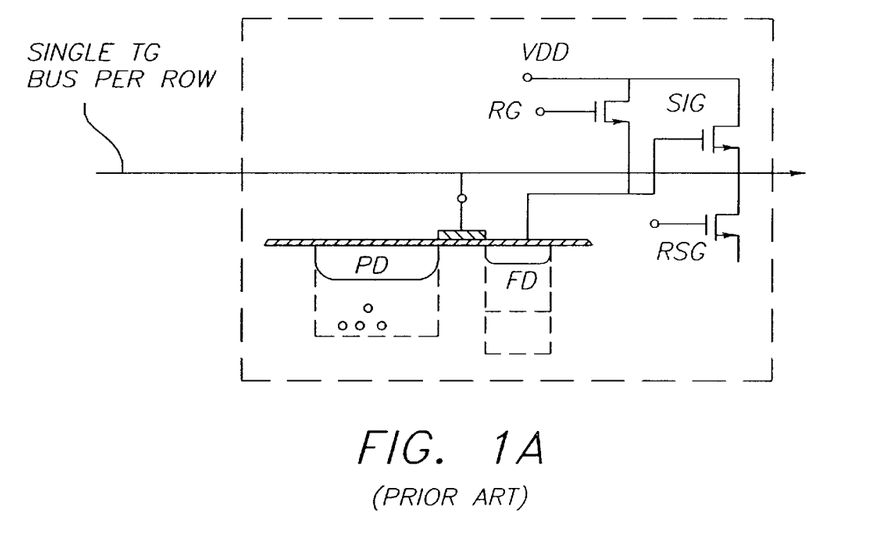
FIG. 1a is a prior art APS pixel.
Figure 1B:
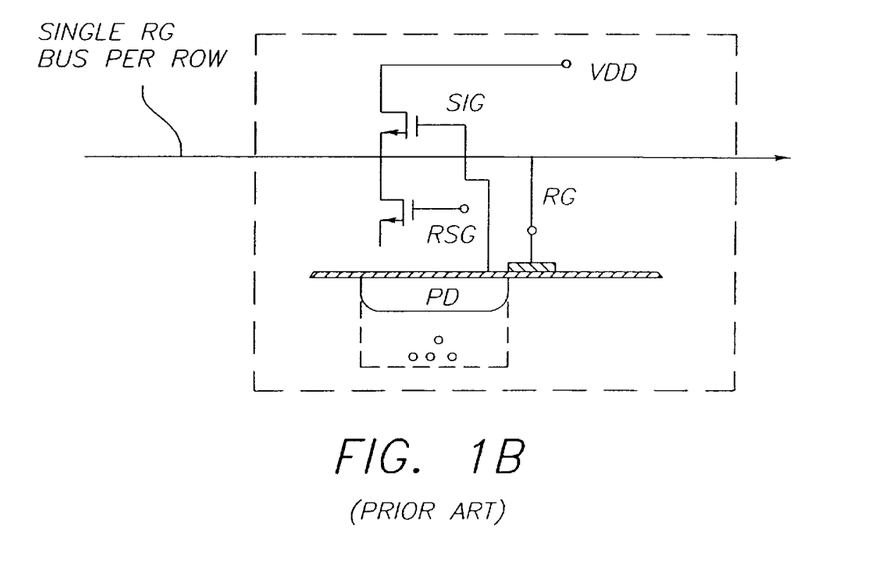
FIG. 1b is a prior art APS pixel.

Typical prior art APS pixels are shown in FIGS. 1a and 1b. The pixel in FIG. 1a comprises a photodetector (PDET), that can be either a photodiode (PD) or photogate (PG), transfer gate (TG), floating diffusion (FD), reset transistor with a reset gate (RG), row select transistor with a row select gate, (RSG), and signal transistor (SIG). The pixel in FIG. 1b comprises a photodetector (PDET), typically a photo-diode (PD), reset transistor with a reset gate (RG), row select transistor with a row select gate, (RSG), and signal transistor (SIG). In all prior art pixels the TG, RG and RSG nodes within a pixel were connected together by a single buss per row of pixels to facilitate the per row sensor readout mode described above. Since the integration time for the pixel in FIG. 1a is determined by the time from when TG is turned off to begin integration and then turned on to transfer charge to the FD, the integration time for each pixel in that row was the same. This is also the case for the pixel in FIG. 1b, where the integration time is determined from the time that RG is turned on to reset the PD and when the read signal is applied to read the charge in the PD.

In prior art devices, the image capture for each row is typically done sequentially with the image capture for each row temporally displaced from every other row, and each row has the same integration time. In color imaging applications a color filter array (CFA) is placed over the image sensor. These individual color filters typically, allow varying amounts of optical energy to pass through the filter and become incident on the sensor. Color filters do not inherently pass the requisite amount of optical energy desired for color balance or that desired for display purposes.

Accordingly, signal processing, whether analog or digital, must be performed on the sensor output to provide the appropriate gain to each color channel in order to produce the desired color balance. With APS devices, this voltage domain signal processing can be done on chip, but this results in the disadvantages of: (1) inducing noise in the sensor; and (2) requiring complicated circuits that consume silicon area, dissipate more power, and slow down frame rates.

In view of the foregoing discussion, it should be apparent that there remains a need within the prior art for an APS device with improved color balancing.

SUMMARY OF THE INVENTION

The present invention addresses the previously discussed problems by enabling programmable color balancing of a color image sensor without creating the disadvantages described above. One approach to providing a programmable color balance means without voltage domain signal processing is to adjust the integration time for each color. In this manner, the resulting signal charge generated within the pixel is in proportion to the desired color balance and no other post processing is required. This invention provides a manner of separate integration control for any given color while maintaining the same sensor readout scheme and allowing for the elimination of the added voltage domain color balance signal processing required in prior art devices. This is done by providing separate transfer gate busses or reset gate busses for each color in a given row. By doing so, the integration time for each color within a given row can be controlled separately.

The present invention is directed to overcoming one or more of the problems set forth above. Briefly summarized, according to one aspect of the present invention, presents a semiconductor based image sensor comprising: a plurality of pixels formed upon a major surface of a semiconductor substrate, each of the pixels having a photodetector; a plurality of color filters of at least two different colors arranged over the pixels; a plurality of transfer gates, the transfer gates being adjacent to the photodetectors and controlled by one of a plurality of electrodes, the transfer gates being capable of modulating the electrostatic potential adjacent to the photodetector upon application of a predetermined voltage to the electrode for that transfer gate to transfer charge from the photodetector to a sense node; a plurality of busses arranged such that there is at least one color buss for each color of the different colors, each of the busses being operatively connected to the transfer gates associated with only one of the different colors through one of the electrodes; a timing circuit having at least one connection to each of the color busses and capable of generating the predetermined voltage on the busses at a predetermined time; whereby each of the different colors can have an integration period that is controlled by the timing circuit independent other of the different colors.

These and other aspects, objects, features, and advantages of the present invention will be more clearly understood and appreciated from a review of the following detailed description of the preferred embodiments and appended claims, and by reference to the accompanying drawings.

Advantageous Effect of the Invention

The present invention has the following advantages: it is efficient in the use of silicon area, it provides a high Signal to Noise Ratio (SNR), and it provides programmable color balance.

BRIEF DESCRIPTION OF THE DRAWINGS

To facilitate understanding, identical reference numerals have been used, where possible, to designate identical elements that are common to the figures.

DETAILED DESCRIPTION OF THE INVENTION

Figure 2:
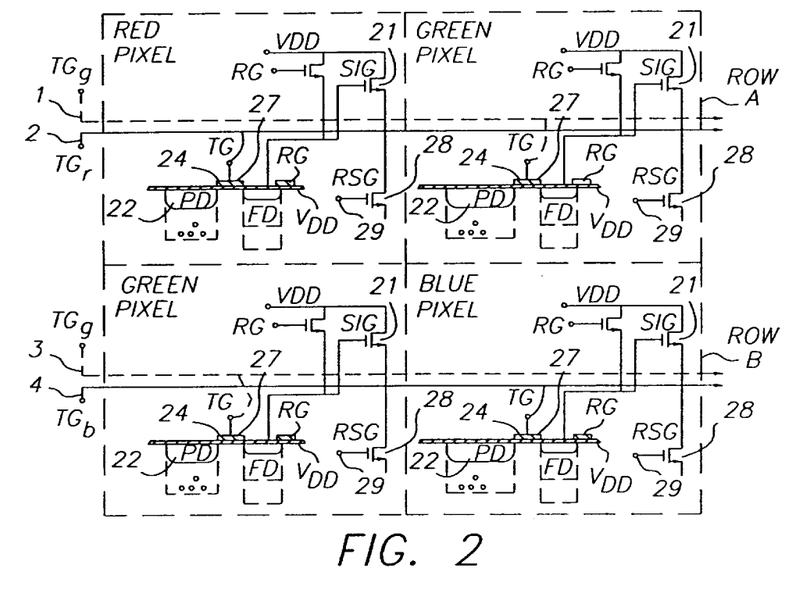
FIG. 2 is a first preferred embodiment of the invention.
Figure 3:
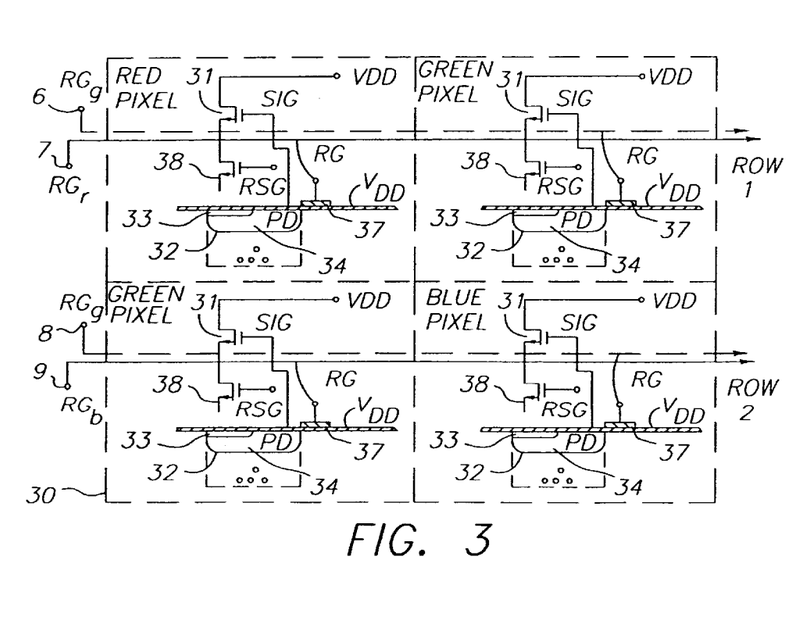
FIG. 3 is a first preferred embodiment of the invention.
Figure 4A:
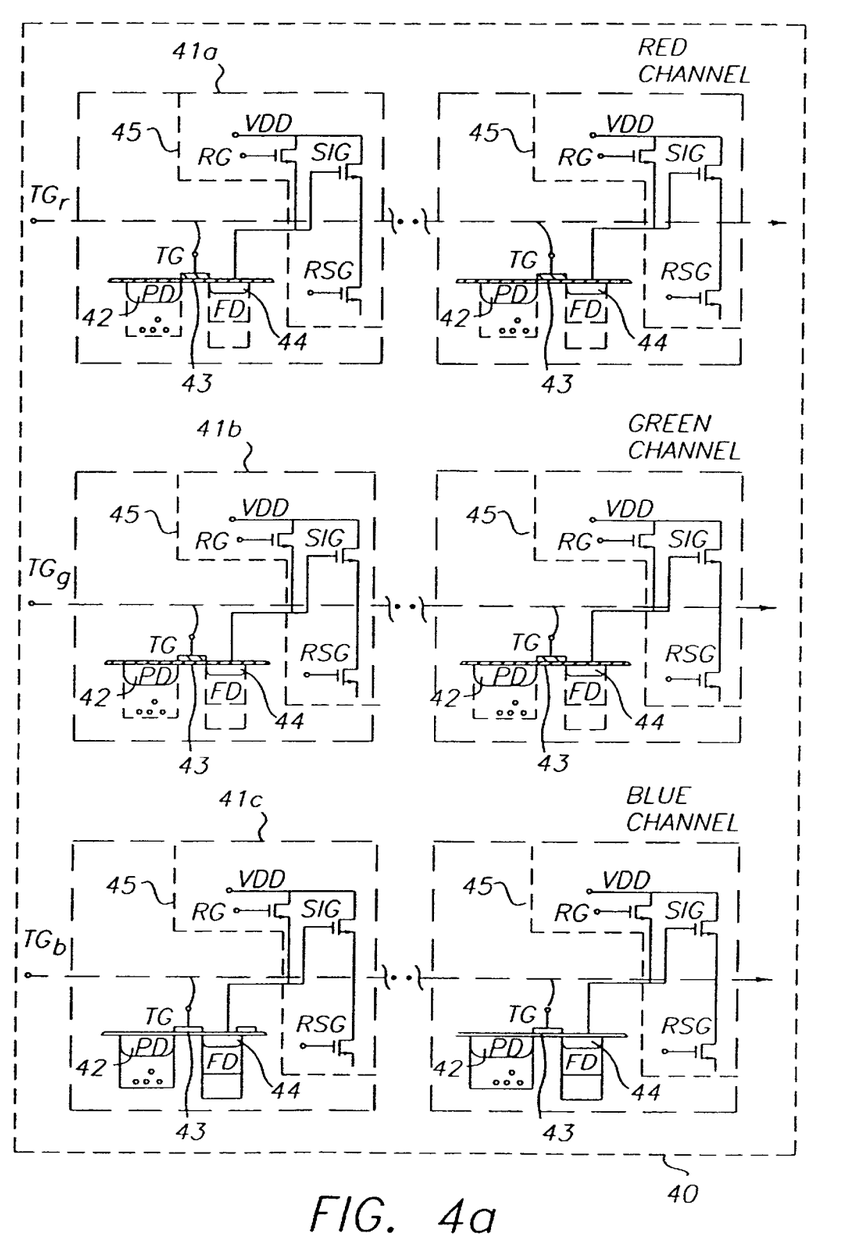
FIG. 4a is a linear embodiment of the invention having three linear sensors.
Figure 4B:
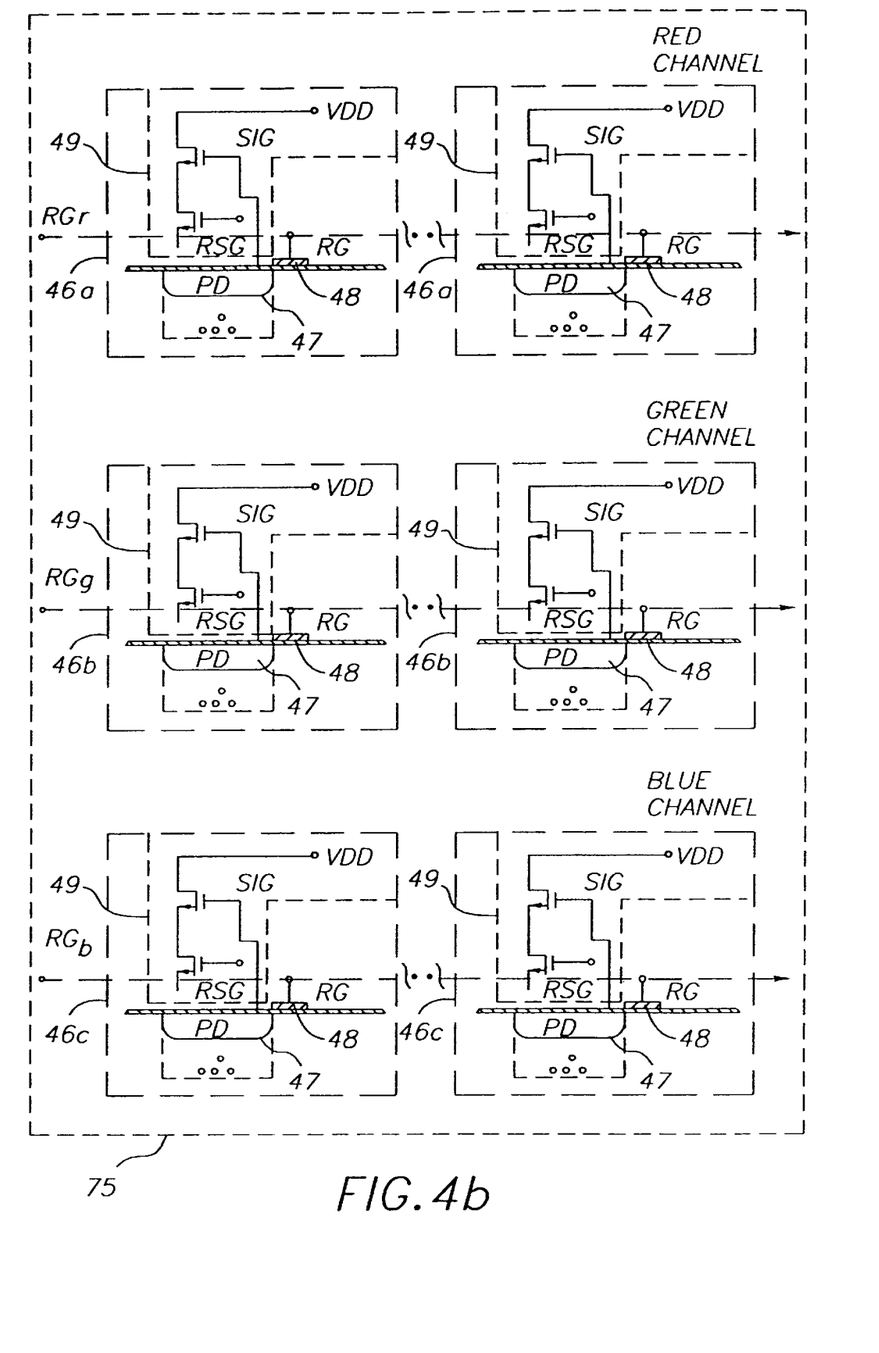
FIG. 4b is another linear embodiment of an active pixel sensor.

The new pixel architecture as envisioned by the preferred embodiments of the present invention can be seen in FIGS. 2, 3 and 4. Other specific physical embodiments are realizable. These are chosen because they are the most preferred manner known to the inventor for practicing the invention.

Each of the diagrams shown in FIGS. 2 and 3 illustrates an array of 4 pixels that incorporates the present invention within sensors having pixels arranged in row and columns. In each of FIGS. 2 and 3, the pixels illustrated are arranged in a quadrant having 2 rows of 2 pixels each forming 2 pairs of row adjacent pixels. The CFA pattern illustrated is based on the Bayer CFA pattern in which one row will have alternating red and green pixels and the following row will have alternating green and blue pixels with the pattern arranged such that the green pixels in succeeding rows are not row adjacent. The structural layout for each of the pixels within the respective figure is identical, containing the identical components in the identical locations.

It should be readily apparent that the layout of the individual pixels within FIGS. 2 and 3 are similar to the pixels shown in FIGS. 1a and 1b, respectively. This is done purposely to illustrate the concept of the invention over the prior art.

Referring to FIG. 2, the pixel architecture 20, comprises a photodetector (PD) 22, that can be either a photodiode or photogate, a transfer gate (TG) 24, a floating diffusion (FD) 25, reset transistor 26 with a reset gate (RG) 27, row select transistor 28 with a row select gate (RSG) 29, and signal transistor (SIG) 21. In prior art devices the transfer gates, reset gates and row select nodes within a pixel were each connected by a buss for every row of pixels to facilitate row based readout of the sensor. Since the integration period for the prior art pixel in FIG. 1a begins when the transfer gate is turned off and ends when the transfer gate is turned on to transfer charge to the floating diffusion, the integration period for each pixel in that row was inherently the same, because the transfer gates are connected to a single buss.

Referring to the embodiment illustrated within FIG. 2, the location of transfer gates 24 is designed to enable wiring 2 separate transfer gate signal busses 1, 2 or 3, 4 for each row. In this case there is a green transfer gate (TGg) buss 1 and a red transfer gate (TGr) buss 2 for Row A, and a TGg buss 3 and blue transfer gate (Tgb) bus 4 row 2. The TGr buss 2 in Row A has an electrical contact to each the transfer gates 24 for red pixels in that Row A. The TGg buss 1 in Row A has an electrical contact to all the transfer gates 24 for the green pixels in that row. The TGg buss 3 in Row B has an electrical connection to each transfer gate 24 used on the green pixels for Row B, while the TGb buss 4 in Row B forms an electrical connection with each transfer gate 24 for the blue pixels in Row B.

One mode of operation of this new architecture design is described below referring to FIG. 2 in conjunction with FIG. 8. This is referred to as the focal plane shutter mode. It is envisioned that other modes using the configuration shown in FIG. 2 are also possible, however, this one illustrated is this best mode for this particular configuration as envisioned by the inventor. For the color used within the pixel architecture 20 as shown in FIG. 2 it can be assumed that red has the highest sensitivity, and blue has the lowest sensitivity. The image sensor is initialized with all the transfer gates 24 and the reset gates 27 are turned on prior time $\tau_1$ as seen referring to FIG. 8. To begin the integration period of Row A, TGg buss 1 is turned off to allow charge to accumulate within photodetector 22. This will occur simultaneously for all the green pixels in Row A. A predetermined time later, TGr buss 2 is turned off which allows all the red pixels within Row A to begin to accumulate charge. Row A at this point has all pixels within the integration period. Row A is integrated for the desired time, the FD is reset and the reset level sampled and held, then both TGr and TGg are turned on at the same time to transfer the signal charge to the floating diffusion. The signal level is then sampled and held. Meanwhile row 2 has been integrating, the TGb was turned off first and earlier in the line time compared to TGg, followed by turning off TGr. Row 2 is then read out in the same manner as row 1. This proceeds for all of the rows in the image sensor, with the same TG timing, odd rows like row 1, even rows like row 2. The relative integration times, determined by the relative location of TG turning off in a row time, are adjusted to provide the desired color balance. The least sensitive color would have the maximum integration time, or that which is programmed, and the other colors" integration times are appropriately shorter and can even be specified as a ratio of the programmed integration time. FIG. 9 shows an alternative mode of operation of the device in FIG. 2 wherein all integration periods occur within the same time epoch.

Referring now to FIG. 3, the pixels 3 comprise a photodetector (PD) 32, typically a photodiode, reset transistor 36 with a reset gate (RG) 37, row select transistor 38 with a row select gate 39 (RSG), and signal transistor (SIG) 31. This is a similar arrangement to the prior art device shown in FIG. 1b, wherein, the integration time for each pixel in a row is the same. Here the integration period is determined from the time the reset gate is turned off after resetting the photodetector until the time when the read signal is applied to read the charge within the photodetector. Again, the integration period for each pixel in that row was inherently the same, because the reset gates are connected to a single bus.

The embodiment illustrated within FIG. 3, is designed to provide wiring of 2 separate reset gate signal busses 6, 7 or 8, 9 for each row. As shown in FIG. 3, there is a red reset gate (RGr) bus 7 and a green reset gate (RGg) buss 8 for Row 1, and a RGg bus 8 and a blue reset gate (RGb) buss 9 for Row 2. The RGr buss 7 in Row 1 have electrical connections to the reset gates 37 for all of the red pixels in that row. The RGg buss in Row 1 has electrical connections to the reset gates 37 for all of the green pixels in that row. The RGg buss 8 in Row 2 has electrical connections to the reset gates 37 for all of the green pixels in Row 2, while the RGb buss 9 in Row 2 has electrical connections contacts to the reset gates 37 for all of the blue pixels in Row 2.

The embodiment in FIG. 3 provides similar features to the embodiment shown in FIG. 2 except there is no transfer gate in the architecture shown in FIG. 3 and reset gates 37 are used to determine integration periods. The pixel architecture 30 can employ Reset gates 37 for determination of integration periods because of the photodetector 32 employed. The Photodetector 32 can be either a standard photodiode or a partially pinned photodiode having both a pinned portion 33 and an unpinned portion 34. The pinned portion 33 forms a large area of the photodetector that is a pinned photodiode. The unpinned portion 34 can function as a floating region that is used as an input node for signal transistor 31.

The operation of this pixel architecture 30 is described below referring to FIG. 3. For the color used within the pixel architecture 30 as shown in FIG. 3 the discussion that follows is similar to that previously discussed for FIG. 2 where it can be assumed that red has the highest sensitivity, and blue has the lowest sensitivity. The image sensor is initialized with all the reset gates 37 are turned on. To begin the integration period of Row 1, RGg buss 6 is turned off to allow charge to accumulate within photodetector 32. This will occur simultaneously for all the green pixels in Row 1. A predetermined time later, RGr buss 7 is turned off which allows all the red pixels within Row 1 to begin to accumulate charge. Row 1 at this point has all pixels within the integration period. Row 1 is integrated for the desired time, the signal level sampled and held. The reset gates for both colored pixels are turned on and the reset level is then sampled. Meanwhile Row 2 has been integrating, the RGb 9 was turned off first and earlier in the line time compared to RGg 8. Row 2 is then read out in the same manner as Row 1. This proceeds for all of the rows in the image sensor, with the same timing, odd rows like Row 1, even rows like Row 2. The relative integration times, determined by the reset gates 37 turning off in a row time, are adjusted to provide the desired color balance. The least sensitive color would have the maximum integration time, or that which is programmed, and the other colors" integration times are appropriately shorter and can even be specified as a ratio of the programmed integration time.

With this charge domain method of providing color balance, the SNR is superior since the integration of noise electrons is minimized, and there is less signal processing required, which can add circuit noise and induce substrate fluctuations that produce in pixel electron noise.

This architecture provides a very area efficient and high SNR means of achieving programmable color balance. One extra metal line per row is required with the Bayer CFA pattern shown. It is possible that more than 1 extra buss per row is required for other CFA patterns. However, with many levels, of metal available in CMOS processes, 1 additional metal line does not impact fill factor, since metal levels can be routed over each other and there are no extra transistors or gates required within the pixel. Additionally, this architecture can be used with the present single amplifier readout schemes, and has identical pixels so that image artifacts due to different image sampling apertures do not occur. There are some extra per row decode logic circuits required. However, these do not impact the pixel or image array area since they are incorporated in the CMOS logic outside of the image array, and these operate on a per row rate and do not produce additional noise in the image processing signal chain.

It should also be noted that this concept of a separate transfer gate or reset gate signal buss per color can also be applied to an entire image array rather than per row as described. This would be desirable in cases where a mechanical shutter is closed during readout to facilitate frame capture mode of operation.

Figure 10:
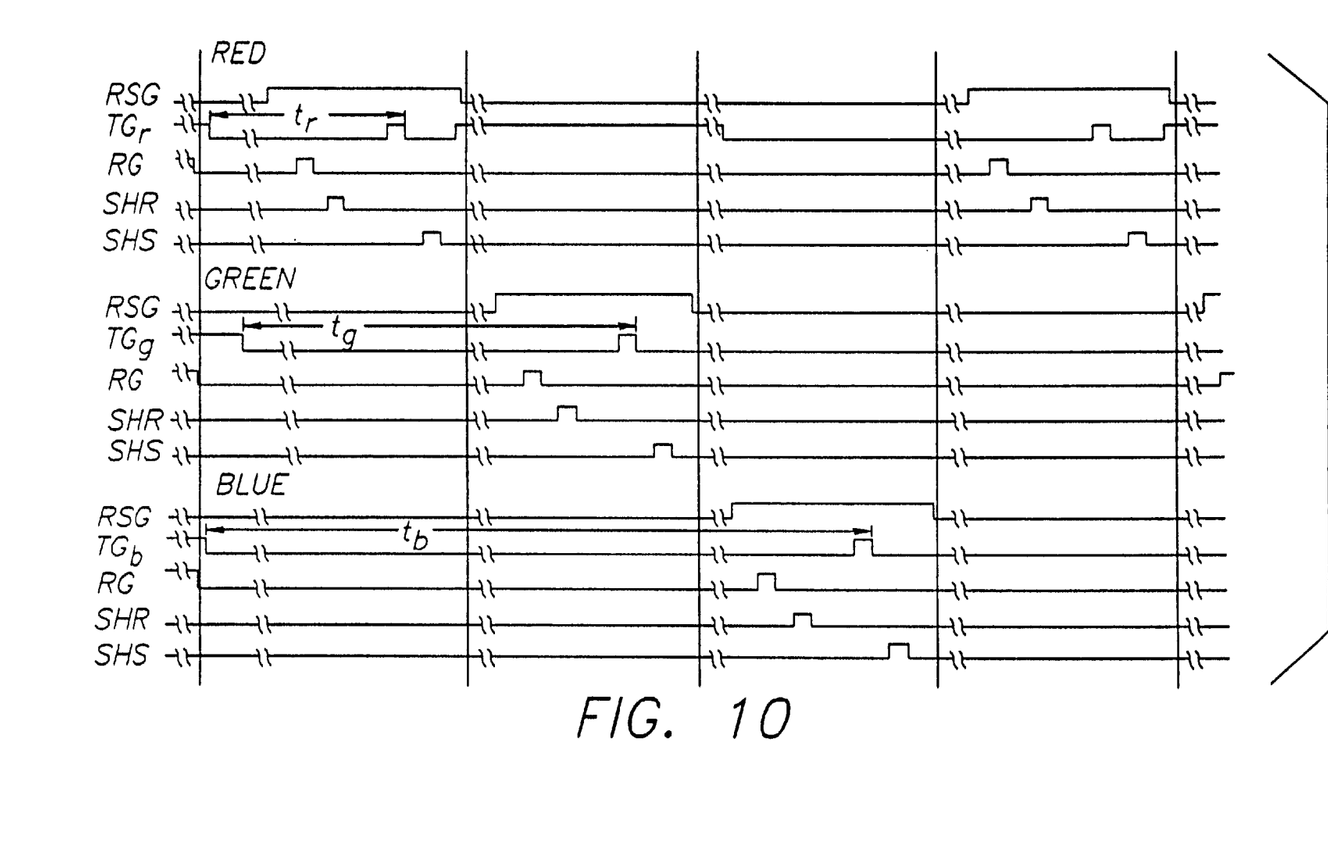
FIG. 10 is a timing diagram for the Focal Plane Shutter Mode for a linear device of the present invention.
Figure 11:
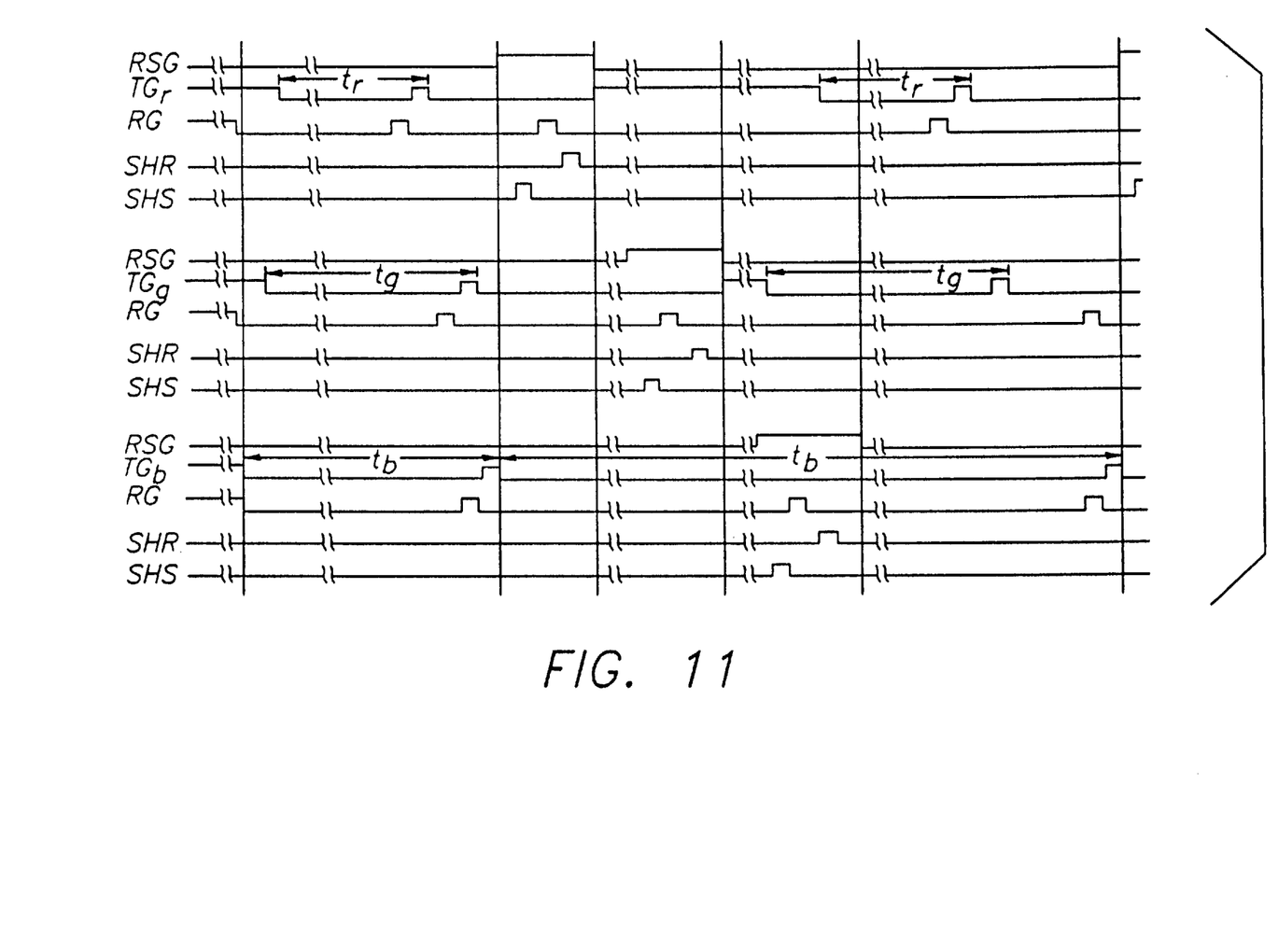
FIG. 11 is a timing diagram for another Global Shutter Mode for a linear device of the present invention.

FIG. 4a is an illustration of a linear embodiment of the present invention within a tri-linear device 40. Timing diagrams for the operation of this device is shown in FIGS. 10 and 11. The tri-linear device 40 has three linear sensors 41a, 41b, and 41c. Each of the linear sensors 41a, 41b and 41c has a photodetector the comprises a photodiode 42, a transfer gate 43 and a floating diffusion 44. Additionally, each of the linear sensors 41a, 41b and 41c has a control circuit 45 comprising a row select transistor (RSG), a reset gate (RG) and a signal transistor (SIG). Here, the three linear devices 41a, 41b, and 41c each have color filters that adapt the linear sensors 41a, 41b and 41c, respectively, to be sensitive to either red, green and blue wavelengths. More importantly each of the linear sensors 41a, 41b and 41c have separate transfer gate busses TGr, TGg and TGb respectively such that each sensor 41a, 41b and 41c can have its integration period individually controlled via a transfer gate bus.

FIG. 4b is another linear embodiment of an active pixel sensor having individual linear sensors 46a, 46b and 46c, each comprising a photodiode 47 adjacent to a reset gate 48 with a control circuit 49 comprising signal transistor (SIG) and row select gate (RSG). As in the previous linear device embodiment described above, each of the linear sensors, 46a, 46b and 46c, in FIG. 4b have individual reset gate busses RGr, RGg and RGb which have their potentials controlled independently from one another. The reset gate busses RGr, RGg and RGb allow independent control of the reset for each of the different linear sensors 46a, 46b and 46c. The integration time period for the linear sensors within FIG. 4b begins after the reset of a pixel and continues until the charge stored within the photodiode is sensed by the SIG. Accordingly, the separate reset gate busses RGr, RGg and RGb allow for independent control of each of the linear sensors 46a, 46b and 46c.

Figure 5A:
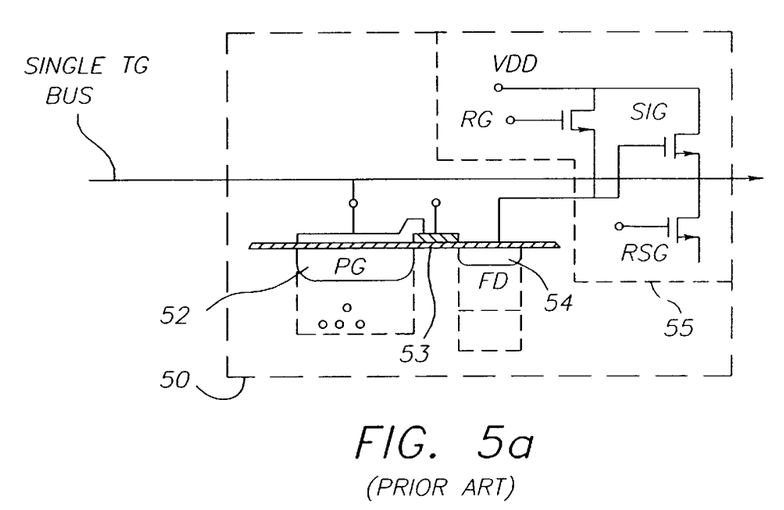
FIG. 5a is a prior art active pixel sensor based on a photogate based pixel.

FIG. 5a is a prior art active pixel sensor 50 having a photogate 52 based pixel that transfers the charge from photogate 52 to the floating diffusion 54 via a transfer gate 53. The integration period is determined by the time between the photogate 52 being taken out of accumulation and put into depletion to begin integration, and the time when the photogate is subsequently placed back into accumulation to transfer the signal charge to the floating diffusion 54. Once charge is transferred to the floating diffusion 54 it can be sensed by the control circuitry 55 that comprises reset gate (RG), row select gate (RSG) and signal (SIG) transistor. The floating diffusion acts as an input to the SIG transistor. The prior art device in FIG. 5a has a single bus for control of the photogates 52 for every for of the image sensor.

Figure 5B:
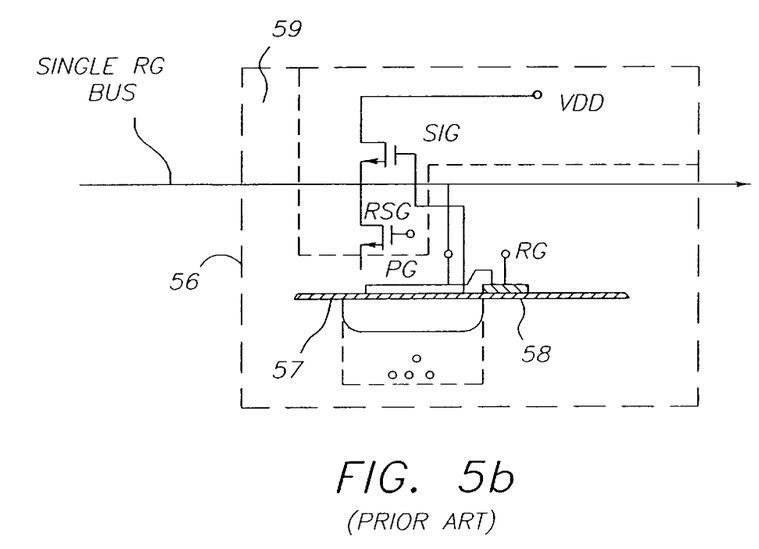
FIG. 5b is another prior art active pixel sensor based on a photogate based pixel.

FIG. 5b is another prior art active pixel sensor based on a photogate 57 that transfers the charge from photogate 57 to the SIG transistor within control circuitry 59 directly. The operation is similar to that discussed above for the prior art device in FIG. 5a, however, the integration period here is determined by placement of the phototogate 57 into accumulation to facilitate a reset after reading the signal level. Accordingly, the integration period is that period from the resetting of the pixel 56 via reset gate 58 to the time where SIG transistor reads the charge level on the photogate 57.

Figure 6:
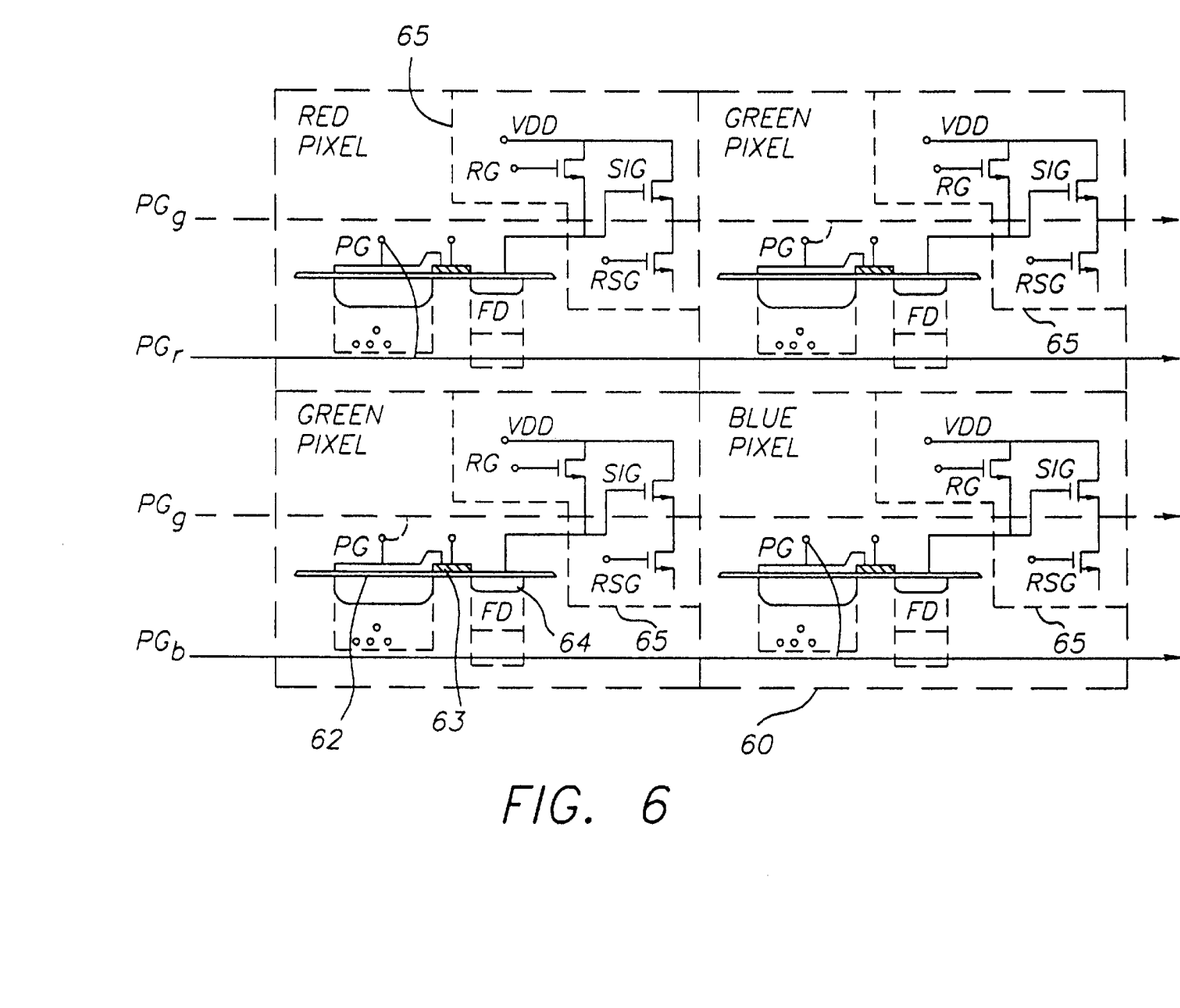
FIG. 6 is an embodiment of the invention having active pixel sensor based on a photogate based pixel.
Figure 7:
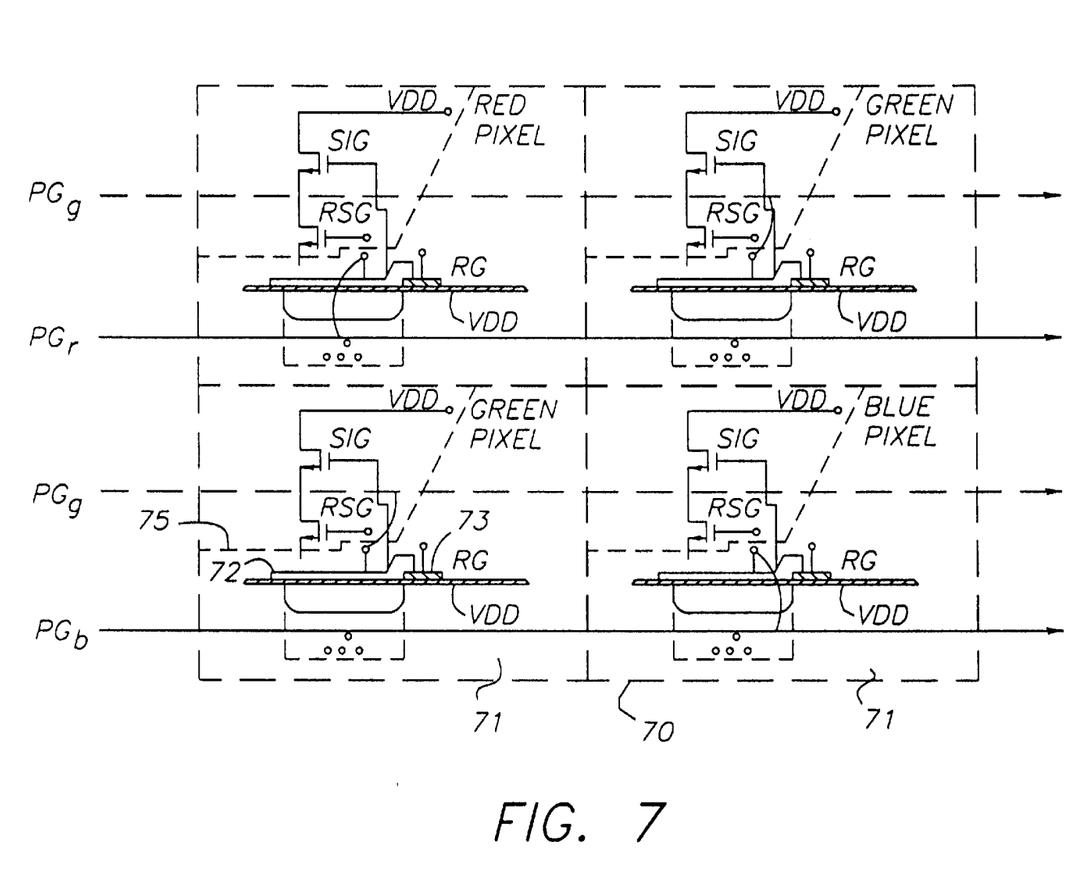
FIG. 7 is an embodiment of the invention having active pixel sensor based on a photogate based pixel.

FIG. 6 is an illustration of the invention having an active pixel sensor based on pixel architecture 60 that employs a photogate 62 that transfers charge to the floating diffusion 64 by biasing the photogate 62 in accumulation. The integration period is determined by the time between when photogate 62 is placed into depletion to begin integration, and the time when the photogate is subsequently placed back into accumulation to transfer the signal charge to the floating diffusion 64. Once charge is transferred to the floating diffusion 64 it can be sensed by the control circuitry 65 that comprises reset gate (RG), row select gate (RSG) and signal (SIG) transistor. The floating diffusion acts as an input to the SIG transistor. The difference between the prior art pixel seen in FIG. 5a and that shown in FIG. 6 is that FIG. 7 is an embodiment of the invention having active pixel sensor 70 based on a photogate based pixel 71 wherein photogate 72 integrates as long as the photogate 72 is biased in depletion. The integration period here is determined by placement of the phototogate 72 into accumulation to facilitate a reset after reading the signal level. Accordingly, the integration period is that period from the resetting of the pixels within sensor 70 via biasing the photogate 72 in accumulation and transferring charge over the reset gate 73, and then biasing the photogate 72 in depletion mode, to the time where SIG transistor reads the charge level on the photogate 72. The invention as seen in FIG. 7 differs from the prior art pixel seen in FIG. 5b in addition of separate busses PGr, PGg and PGb for red, green and blue, respectively, to provide independent control of the photogates 72.

Figure 8:
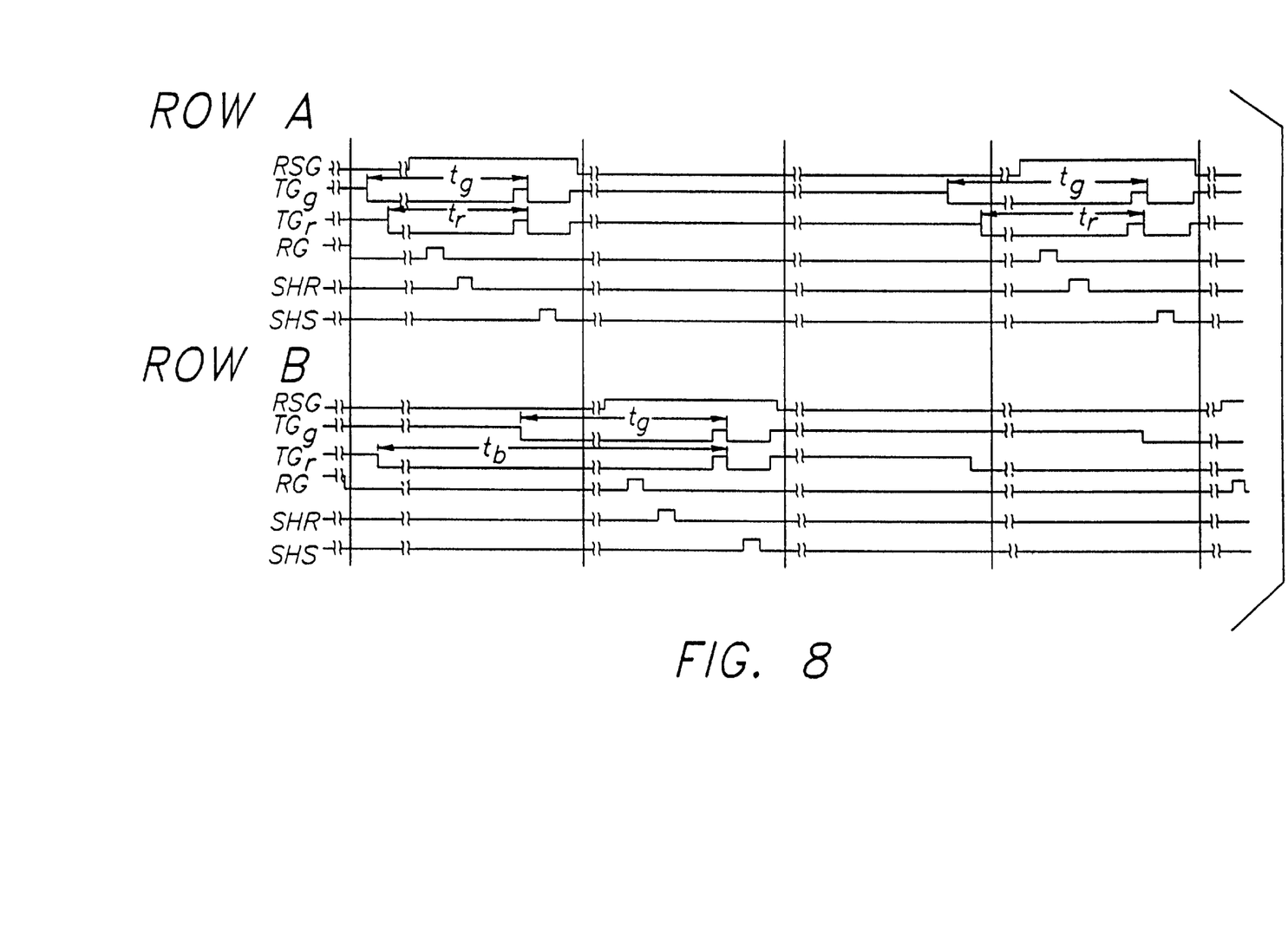
FIG. 8 is a timing diagram for the Focal Plane Shutter Mode for an area array of the present invention.
Figure 9:
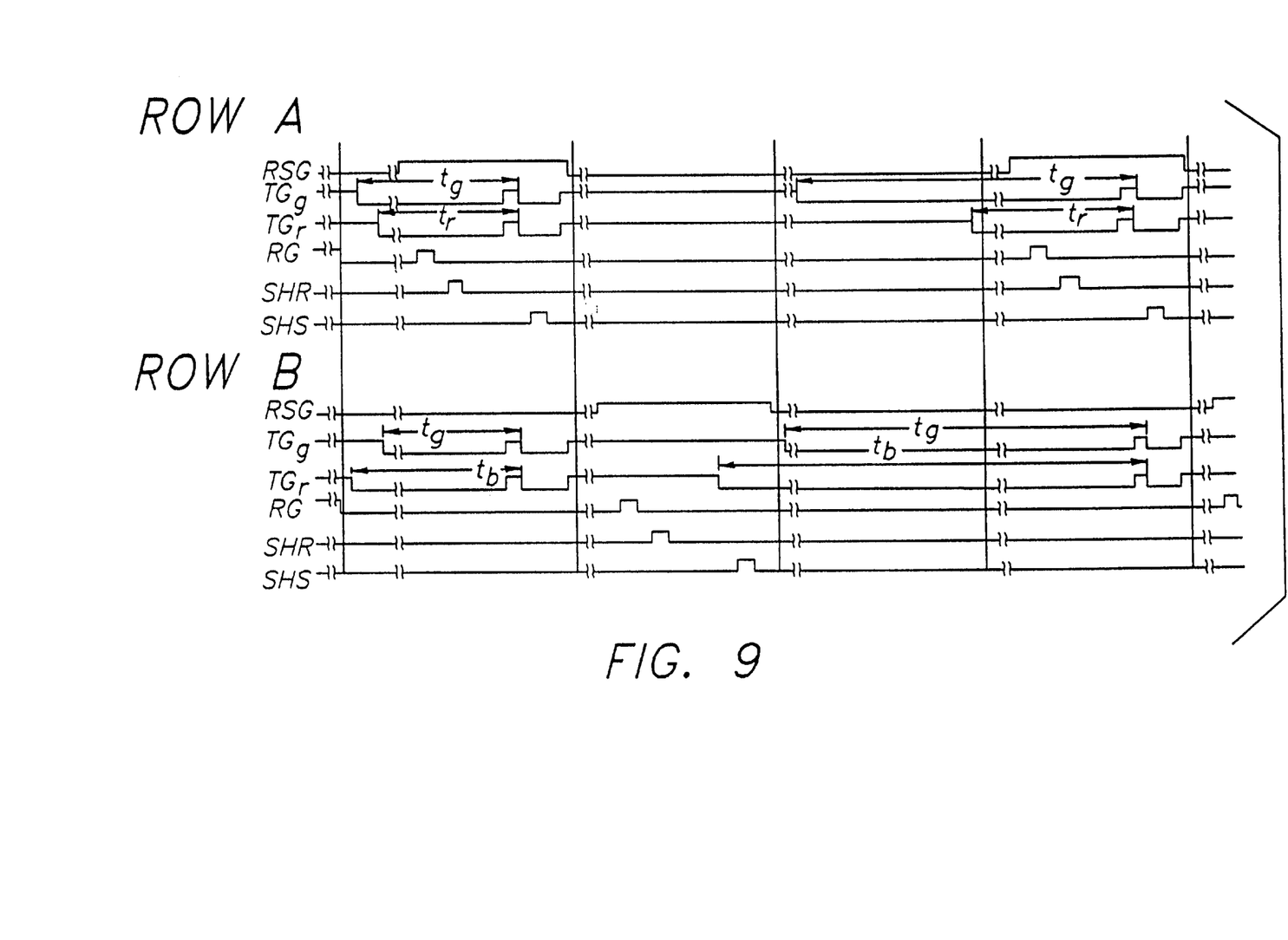
FIG. 9 is a timing diagram for the Global Shutter Mode for an area array of the present invention.

Referring to FIG. 8, which is a timing diagram for the Focal Plane Shutter Mode for an area array of the present invention as depicted in FIG. 2. The length of each of the integration periods is adjusted to achieve the correct color balance. $\tau_g$ represents the integration period for green pixels and occurs in each Row A and Row B. $\tau_r$ represents the integration period for the red pixels and is the shortest integration period. $\tau_b$ represents the integration period for the blue pixels and is the longest of the integration periods.

FIG. 9 is a timing diagram for the Global Shutter Mode for an area array of the present invention, as shown in FIG. 2. The symbols for integration periods are the same as those in FIG. 8. It can be seen that the integration periods all end at the same time. The image is thereby captured by all pixels simultaneously. The pixels representing different colors have different integration lengths but the pixels are integrated at the same time. The integration periods for the shortest color (i.e. red) is contained within the integration period of each successively longer channel.

FIG. 10 is a timing diagram for the Focal Plane Shutter Mode for a linear device of the present invention as shown in FIG. 4A. The integration period for the red channel is shown as significantly shorter than the green channel, and the green shorter than the blue channel.

FIG. 11 is a timing diagram for the Global Shutter Mode for the linear device of the present invention as shown in FIG. 4A wherein the integration is done simultaneously for each of the pixel elements within a given color channel. The channels for different colors have different integration lengths but the channels are integrated at the same time. The integration periods for the shortest channels (i.e. red) are contained within the integration periods of each successively longer channel. Here, the integration periods for each color channel start and stop at different points in time so that the center of each integration period is at the same point in time. It should be understood that the integration periods do not have to be centered with respect to each other.

The foregoing description describes the best modes known to the inventor for practicing the invention. Obvious variations of these modes will be apparent to those skilled in the art, accordingly the scope of the invention should be measured by the appended claims.

| PARTS LIST | |
|---|---|
| 1 | transfer gate bus (Green) TGg |
| 2 | transfer gate bus (red) TGr |
| 3 | transfer gate bus (green) TGg |
| 4 | reset gate bus (blue) Rgb |
| 6 | reset gate bus (Green) RGg |
| 7 | reset gate bus (red) RGr |
| 8 | reset gate bus (green) RGg |
| 9 | reset gate bus (blue) Rgb |
| 20 | pixel architecture |
| 21 | signal transistor |
| 22 | photodetector |
| 24 | transfer gate |
| 25 | floating diffusion |
| 26 | reset transistor |
| 27 | reset gate |
| 28 | row select transistor |
| 29 | row select gate |
| 30 | pixel architecture |
| 31 | signal transistor |
| 32 | photodetector |
| 33 | pinned portion |
| 34 | unpinned portion |
| 35 | floating diffusion |
| 36 | reset transistor |
| 37 | reset gate |
| 38 | row select transistor |
| 39 | row select gate |
| 40 | tri-linear device |
| 41a | red linear sensor |
| 41b | green linear sensor |
| 41c | blue linear sensor |
| 42 | photodiode |
| 43 | transfer gate |
| 44 | floating diffusion |
| 45 | control circuit |
| 46a | red linear sensor |
| 46b | green linear sensor |
| 46c | blue linear sensor |
| 47 | photodiode |
| 48 | reset gate |
| 49 | control circuit |
| 50 | active pixel sensor |
| 52 | photogate |
| 53 | transfer gate |
| 54 | floating diffusion |
| 55 | control circuitry |
| 56 | pixel |
| 57 | photogate |
| 58 | reset gate |
| 59 | control circuitry |
| 60 | pixel architecture |
| 62 | photogate |
| 63 | transfer gate |
| 64 | floating diffusion |
| 65 | control circuitry |
| 70 | active pixel sensor |
| 71 | pixel |
| 72 | photogate |
| 73 | reset gate |
| Rgr | red reset gate bus |
| RGg | green reset gate bus |
| RGb | blue reset gate bus |
| Row A | first row |
| Row B | second row |
| Row 1 | first row |
| Row 2 | second row |
| RSG | row select gate |
| SIG | signal transistor |

What is claimed is:
1. A semiconductor based, active pixel image sensor comprising:
an active pixel sensor comprising:
a plurality of active pixels formed upon a major surface of a semiconductor substrate, a plurality of the pixels having a photodetector which plurality of pixels are arranged in a plurality of columns and rows for forming a two dimensional array; wherein the active pixels convert a charge packet to voltage signal;

a plurality of color filters of at least two different colors arranged over a majority of the pixels for forming colored pixels which are arranged with at least two different colored pixels in a single row;

a plurality of transfer gates, the transfer gates being adjacent to the photodetectors and controlled by one of a plurality of electrodes, the transfer gates being capable of modulating the electrostatic potential adjacent to the photodetector upon application of a predetermined voltage to the electrode for that transfer gate to remove charge from the photodetector;

at least two buses per row arranged such that there is at least one bus for each color of the different colors in the row, each of the buses being operatively connected to the transfer gates associated with only one of the different colors through one of the electrodes; wherein all signals from pixels in a single row are read out substantially simultaneously to their corresponding buses;

interface means for providing an electrical connection to a timing circuit, the interface means having at least one connection to each of the color buses and at least one input from the timing circuit for each connection;

whereby each of the different colors can have an integration period that is controlled by the timing circuit independent from other of the different colors, and the integration time of substantially all colors in the entire two dimensional array ends substantially simultaneously.

2. The image sensor of claim 1 wherein the plurality of pixels are arranged in rows and columns.

3. The image sensors of claim 2 wherein the image sensor has three colors with only two colors in any given row and with row adjacent pixels not being of the same color.

4. The image sensor of claim 1 wherein the sensor is an active pixel sensor having CMOS control circuitry allocated for, essentially, each of the pixels.

5. The image sensor of claim 4 wherein each of the transfer gates have a floating diffusion area as the sense node that is connected as an input to a signal transistor, the signal transistor formed in CMOS.

6. The image sensor of claim 1 wherein the sensor is a multiple color linear sensor having at least two linear sensor channels with each of the sensor channels sensitive to light of a different wavelength.

7. The image sensor of claim 6 wherein the sensor is a tri-linear sensor having separately controllable integration times for each of the linear sensors channels determined by voltages on their respective transfer gates which are controlled through a timing circuit.

8. The image sensor of claim 1 further comprising a reset gate adjacent to the sense node, the reset gate being electrically connected to a bus on at least a row by row basis.

9. The image sensor of claim 8 wherein the integration period is controlled by pulsing the transfer gates and reset gates.

10. A semiconductor based, active pixel image sensor comprising:

an active pixel sensor comprising:
a plurality of active pixels formed upon a major surface of a semiconductor substrate, a plurality of the pixels each having a photodetector which plurality of pixels are arranged in a plurality of columns and rows for forming a two dimensional array; wherein the active pixels convert a charge packet to voltage signal;

a plurality of color filters of at least two different colors arranged over a majority of the pixels for forming colored pixels which arranged with at least two different colored pixels in a single row;

a plurality of gates adjacent to the photodetectors and controlled by one of a plurality of electrodes, the gates being capable of draining charge from the photodetector upon application of a predetermined voltage to the electrode for that gate;

a sense node formed within the pixel and operatively connected to CMOS control circuitry;

at least two buses per row arranged such that there is at least one bus for each color of the color filters in the row, each of the buses being operatively connected to the gates associated with only one of the colors through one of the electrodes; wherein all signals from pixels in a single row are read out substantially simultaneously to their corresponding buses;

interface means for providing an electrical connection to a timing circuit, the interface means having individual connections to each of the buses and capable of providing the predetermined voltage on the buses at a desired time;

whereby each color can have an integration period that is controlled by the timing circuit independent from an equivalent integration for the other colors, and the integration time of substantially all colors in the entire two dimensional array ends substantially simultaneously.

11. The image sensor of claim 10 wherein the gates are reset gates.

12. The image sensor of claim 10 wherein the plurality of pixels are arranged in rows and columns.

13. The image sensors of claim 10 wherein the image sensor has three colors with only two colors in any given row and with row adjacent pixels not being of the same color.

14. The image sensor of claim 10 wherein the photodetector has a pinned portion and an unpinned portion and the sense node is formed on the unpinned portion.

15. The image sensor of claim 10 wherein the sense node is operatively connected to CMOS control circuitry as an input to a transistor.

16. The image sensor of claim 10 wherein the sensor has a plurality of linear sensors, with at least two colors being represented on the linear sensors.

17. The image sensor of claim 16 wherein the plurality of linear sensors further comprises a separate linear sensor for each different color.

18. The image sensor of claim 17 wherein each of the separate image sensors has a single bus to control integration time.

19. The image sensor of claim 10 further comprising a transfer gate between the photodetector and the sense node.

20. A semiconductor based, active pixel image sensor comprising:

an active pixel sensor comprising:
a plurality of active pixels formed upon a major surface of a semiconductor substrate, a majority of the pixels having a photodetector which pixels are arranged in a plurality of columns and rows for forming a two dimensional array; wherein the active pixels convert a charge packet to a voltage signal;

a plurality of color filters of at least two different colors arranged over a second majority of the pixels for forming colored pixels which are arranged with at least two different colored pixels in a single row;

a sense node formed within each of the pixels and operatively connected to CMOS control circuitry;

at least two buses per row arranged such that there is at least one unique bus operatively connected to the pixels for each color in the row; wherein all signals from pixels in a single row are read out substantially simultaneously to their corresponding buses; and interface means for providing an electrical connection to a timing circuit, the interface means having individual connections to each of the buses and capable of providing the predetermined voltage on the buses at a desired time;

whereby each color can have an integration period that is controlled by the timing circuit independent from an equivalent integration for the other colors, and the integration time of substantially all colors in the entire two dimensional array ends substantially simultaneously.

21. The invention of claim 20 wherein the photodetector in a photogate.

22. The invention of claim 21 wherein the busses are connected to the photogates.

23. The invention of claim 22 wherein the busses connected to the photogates are operative to control integration timing of the photogates.

24. The invention of claim 21 further comprising a reset gate within each pixel.

25. The invention of claim 21 further comprising a transfer gate and a sense node within each pixel.

26. The invention of claim 20 wherein the integration periods for colors having shorter integration time are contained within the integration periods of colors having longer integration periods.

27. The invention of claim 25 wherein integration periods for each color are centered with respect to the integration periods of other colors.

* * * * *

UNITED STATES PATENT AND TRADEMARK OFFICE
CERTIFICATE OF CORRECTION

PATENT NO. : 6,714,239 B2
DATED : March 30, 2004
INVENTOR(S) : Guidash

It is certified that error appears in the above-identified patent and that said Letters Patent is hereby corrected as shown below:

<u>Column 12,</u>
Line 16, please delete "claim 25" and replace with -- claim 26 --.

Signed and Sealed this

Sixth Day of September, 2005

JON W. DUDAS
*Director of the United States Patent and Trademark Office*